(12) United States Patent
Campbell et al.

(10) Patent No.: US 6,850,322 B2
(45) Date of Patent: Feb. 1, 2005

(54) METHOD AND APPARATUS FOR CONTROLLING WAFER THICKNESS UNIFORMITY IN A MULTI-ZONE VERTICAL FURNACE

(75) Inventors: William Jarrett Campbell, Austin, TX (US); Scott Bushman, Richardson, TX (US); Thomas Sonderman, Austin, TX (US); Elfido Coss, Jr., Austin, TX (US)

(73) Assignee: Advanced Micro Devices, Inc., Austin, TX (US)

( * ) Notice: Subject to any disclaimer, the term of this patent is extended or adjusted under 35 U.S.C. 154(b) by 668 days.

(21) Appl. No.: 09/751,083

(22) Filed: Dec. 29, 2000

(65) Prior Publication Data

US 2002/0085212 A1 Jul. 4, 2002

(51) Int. Cl.[7] .......................... G01N 21/00; G01B 11/28
(52) U.S. Cl. ..................... 356/237.5; 356/630
(58) Field of Search ................... 356/237.1, 237.2, 356/237.5, 600, 630, 632

(56) References Cited

U.S. PATENT DOCUMENTS

| 5,436,172 A | * | 7/1995 | Moslehi ...................... 374/121 |
| 6,329,643 B1 | * | 12/2001 | Suzuki et al. ................ 219/497 |
| 2003/0049372 A1 | * | 3/2003 | Cook et al. ............... 427/248.1 |

* cited by examiner

*Primary Examiner*—Rodney Fuller
(74) *Attorney, Agent, or Firm*—Williams Morgan & Amerson

(57) ABSTRACT

A method and apparatus for controlling wafer thickness uniformity in a multi-zone vertical furnace is provided. The multi-zone furnace bakes a plurality of wafers within each zone for a first bake time. A film thickness of at least one wafer baked in each zone of the furnace is measured using a metrology tool. A film thickness optimization unit determines a deposition rate for the at least one wafer within each zone, with the deposition rate being determined as a function of the film thickness of the wafer and the first bake time. The film thickness optimization unit then determines a second bake time to bake a subsequent set of wafers, and the subsequent set of wafers is baked in the furnace for the second bake time.

18 Claims, 4 Drawing Sheets

METHOD AND APPARATUS FOR CONTROLLING WAFER THICKNESS UNIFORMITY IN A MULTI-ZONE VERTICAL FURNACE

BACKGROUND OF THE INVENTION

1. Field of the Invention

This invention relates generally to wafer fabrication processes, and, more particularly, to a method and apparatus for controlling film thickness uniformity of a plurality of wafers processed by a multi-zone furnace.

2. Description of the Related Art

There is a constant drive in the semiconductor industry to increase the quality, reliability, and throughput of integrated circuit devices such as microprocessors, memory devices and the like. This drive is fueled by consumer demands for higher quality computers and electronic devices that operate more reliably.

These demands by the consumer have resulted in some improvements in the manufacture of semiconductor devices. Reducing defects in the manufacture of these devices lowers the cost of the devices themselves. Accordingly, the cost of the final product incorporating these devices is also reduced, thus providing inherent monetary benefits to both the consumer and manufacturer.

During the course of manufacturing semiconductor devices, wafers may be subjected to one or more heating or baking operations for a variety of reasons. For example, wafers may be subjected to such heating during thermal oxidation processes used to form a layer of silicon dioxide on the wafer. Typically, however, problems are encountered with such heating or baking processes conducted with the wafer. Generally, the wafers are loaded into a multi-zone vertical furnace and are baked by the furnace at a particular temperature for a specified baking time. Usually, the actual temperature within each of the zones will vary from one zone to another within the furnace. The temperature variation between the zones may result because heat from the bottom of the vertical furnace rises to the top, thereby causing the zones near the top of the furnace to be hotter than the zones towards the bottom of the furnace. Additionally, various other factors generally cause variations in temperature between the zones of the furnace, such as the gas flow within the furnace, for example.

When the actual temperature of each zone of the furnace differs, a variation of film thickness between the wafers may undesirably result within the batch of wafers processed by the furnace. Such a variation in film thickness between the wafers may cause defects in these wafers while being processed further down the semiconductor processing line, thereby increasing costs for the manufacturer, and, ultimately, the consumer. For example, if the layers produced on the wafer by the furnace are thicker than anticipated due to a locally increased temperature within a zone of the furnace, subsequent etching processes may not remove all of the layer of material. This may lend to costly rework of the wafers and reduce manufacturing efficiencies.

The present invention is directed to overcoming, or at least reducing the effects of, one or more of the problems set forth above.

SUMMARY OF THE INVENTION

In one aspect of the present invention, a method is provided for controlling a film thickness of a plurality of wafers, with the wafers being baked in a multi-zone furnace for a first bake time. The method includes measuring the film thickness of at least one wafer baked in each zone of the furnace. A deposition rate is determined for each zone of the furnace, the deposition rate being determined as a function of the film thickness of the wafer and the first bake time. A deposition rate of one of the zones is assigned as a baseline for the other zones of the furnace. The deposition rate of the other zones of the furnace is adjusted to be substantially the same as the baseline deposition rate. A subsequent set of wafers in the furnace is baked with the adjusted deposition rates.

In another aspect of the present invention, an apparatus is provided. The apparatus includes a multi-zone furnace adapted to bake a plurality of wafers for a first bake time, with each zone of the furnace accommodating at least one wafer. A metrology tool is further provided and is adapted to measure a film thickness of the at least one wafer baked in each zone of the furnace. A first controller is also provided and is adapted to determine a deposition rate for each zone of the furnace, the deposition rate being determined as a function of the film thickness of the wafer and the first bake time, and further adapted to assign the deposition rate of one of the zones as a baseline for the other zones of the furnace, and to adjust the deposition rate of the other zones of the furnace to be substantially the same as the baseline deposition rate. The furnace is further adapted to bake the subsequent set of wafers in the furnace with the adjusted deposition rates.

BRIEF DESCRIPTION OF THE DRAWINGS

The invention may be understood by reference to the following description taken in conjunction with the accompanying drawings, in which like reference numerals identify like elements, and in which.

Figure 1:
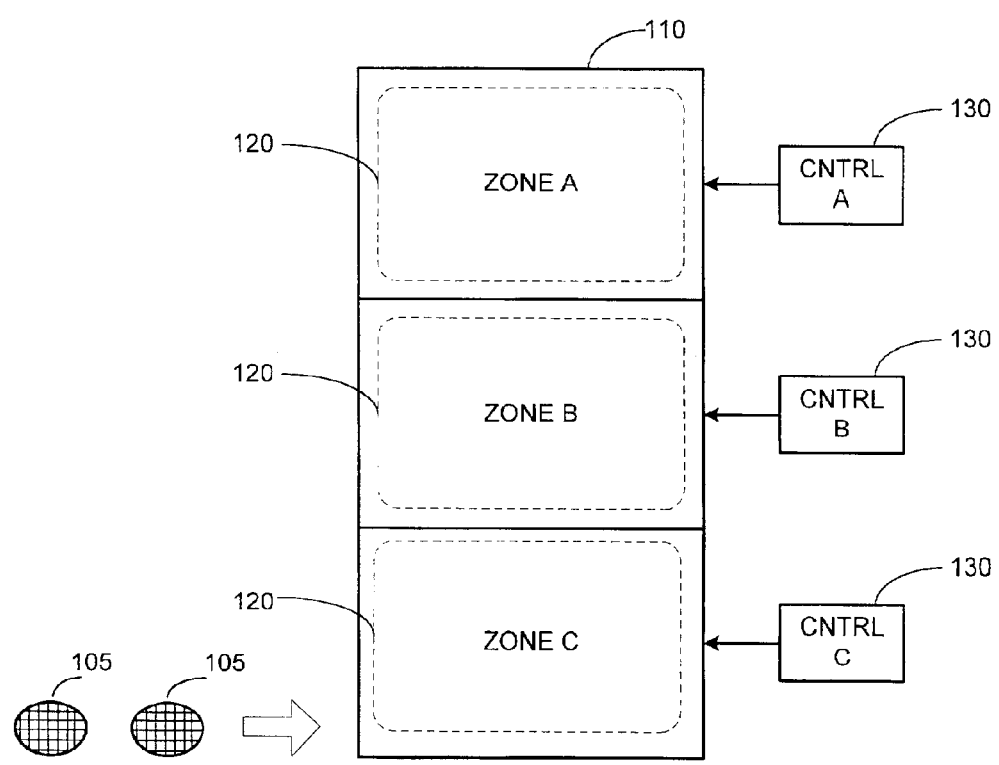
FIG. 1 is a simplified diagram of a vertical furnace divided into a plurality of zones for baking a plurality of wafers.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

Turning now to the drawings, and, specifically referring to FIG. 1, a simplified diagram of a vertical furnace 110 for baking a plurality of wafers 105 is provided according to one embodiment of the present invention. It will be appreciated that although a vertical furnace is provided in the illustrated embodiment, the furnace 110 may alternatively include other types of multi-zoned furnaces, such as, a horizontal furnace, for example, without departing from the spirit and scope of the present invention.

According to one embodiment, the vertical furnace 110 is divided into a plurality of zones 120, which are respectively referred to as zones A, B and C in FIG. 1. Although the furnace 110 in the illustrated embodiment is configured with three zones 120, it will be appreciated that the furnace 110 may alternatively be configured to have a larger or smaller number of zones 120 depending upon the size of the furnace 110, for example.

In accordance with one embodiment, the temperature for each zone 120 of the furnace 110 is individually controlled by zone controllers 130, which are respectively referred to as controllers A, B and C in FIG. 1. It will be appreciated that the zone controllers 130 may be further configured to adjust various other parameters of the furnace 110, such as gas flow within the zones 120, for example. It will be further appreciated that the zone controllers 130 may be configured as a single controller to control each of the zones 120 of the furnace 110 individually.

Each zone controller 130 is adapted to set a temperature for a corresponding zone 120 to yield a desired film thickness for each wafer 105 disposed within the furnace 110. Additionally, each zone controller 130 is further configured to bake the wafers 105 in the furnace 110 for a predetermined bake time. In the illustrated embodiment, a batch of wafers 105 is placed into the furnace 110, with approximately one-third of the wafers 105 in the batch being placed in zone A, another third of the wafers 105 being placed in zone B, and the remaining wafers 105 being placed in zone C.

Ideally, it is desirable to maintain a constant temperature within each of the zones 120 of the furnace 110 to achieve a predetermined, uniform film thickness for each wafer 105 within a given batch. Typically, however, the actual temperature within each of the zones 120 will vary from one zone 120 to another within the furnace 110. For example, the actual temperature of zone A may be higher than that of zone C even though their respective zone controllers 130 (i.e., controller A and controller C) are set to maintain the same temperature. The variance in temperatures between the zones 120 may result, for example, from the phenomenon that heat rises. That is, the heat from zones B and C rise up into zone A causing the temperature of zone A to be higher than that of zones B and C. Of course, there are several other factors that may cause the actual temperature between the zones 120 to vary, such as gas flow between the various zones 120 of the furnace 110, for example. When the actual temperature of each zone 120 varies, a variation of film thickness between the wafers 105 may be undesirably caused within the batch currently processed by the furnace 110. That is, in the zones 120 where the temperature is higher than expected, a thermally grown layer of material, e.g., silicon dioxide, may be thicker than anticipated. Conversely, in the zones 120 where the temperature is less than expected, the thermally grown layer of film may be thinner than anticipated.

Figure 2:
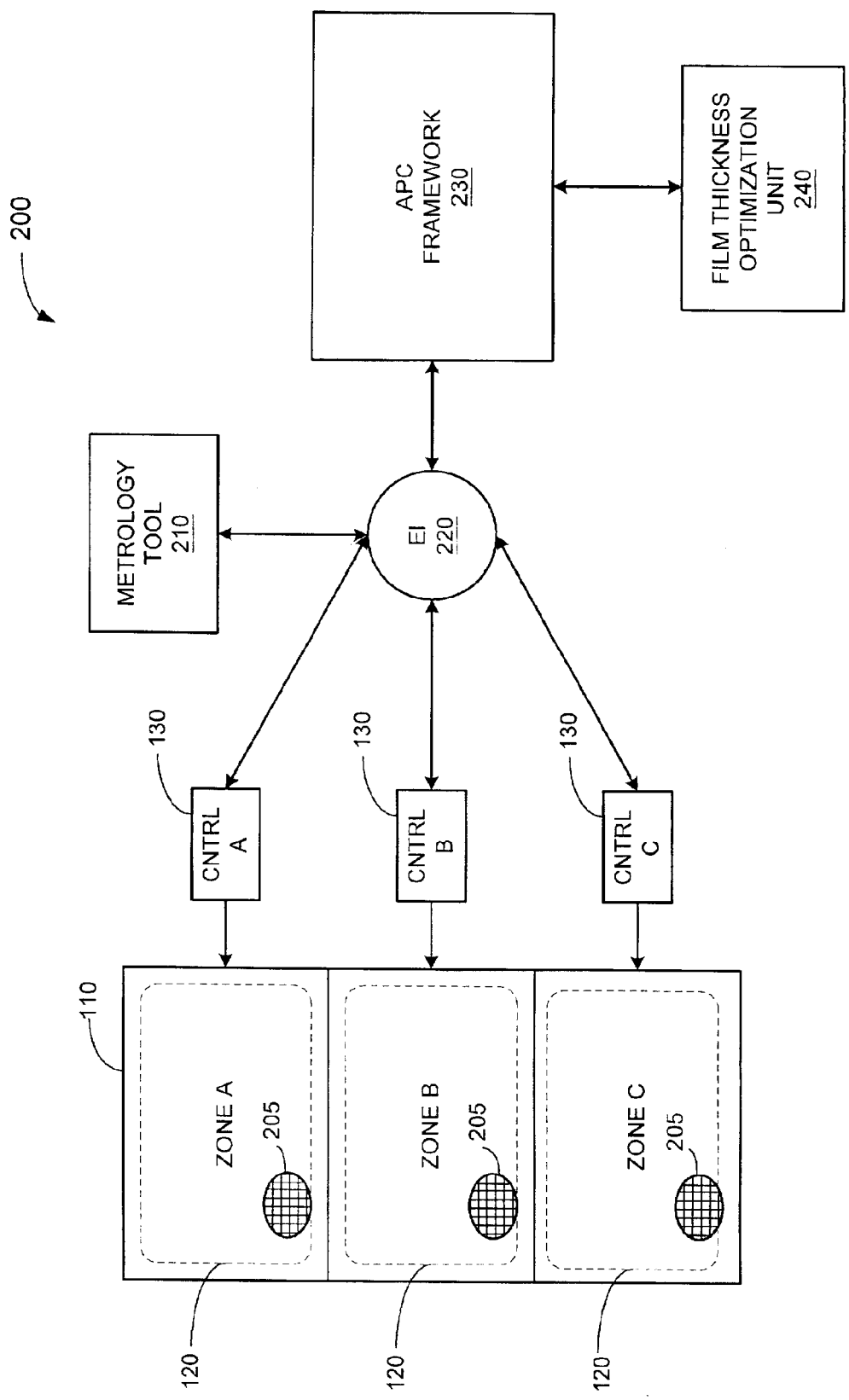
FIG. 2 is a simplified diagram of a system for controlling the film thickness of the plurality of wafers processed by the furnace of FIG. 1 according to one embodiment of the present invention.

Turning now to FIG. 2, a simplified representation of a system 200, for controlling the film thickness of the wafers 105 being processed by the furnace 110, is provided. The system 200 includes the vertical furnace 110 with at least one monitor wafer 205 disposed in each zone 120. In accordance with one embodiment, the monitor wafers 205 may include a select wafer or wafers from the batch of wafers 105 within each zone 120 that are placed in the furnace 110 for baking during a particular process run. The temperature for each zone 120 of the furnace 110 is controlled by the respective zone controller 130 for that zone 120.

In accordance with one embodiment of the present invention, each zone controller 130 is coupled to an equipment interface (EI) 220, which interfaces the furnace 110 to an Advanced Process Control (APC) framework 230. The APC framework 230 is a component-based architecture comprised of interchangeable, standardized software components enabling run-to-run control of the furnace 110, as well as other semiconductor processing equipment (not shown), which process the wafers 105. The APC framework 230 is also coupled to a film thickness optimization unit 240, which determines the appropriate temperature and bake time settings in which to set the furnace 110.

An exemplary software system capable of being adapted to perform the functions of the APC Framework 230 is the KLA Tencor Catalyst system offered by KLA Tencor, Inc. The KLA Tencor Catalyst system uses Semiconductor Equipment and Materials International (SEMI) Computer Integrated Manufacturing (CIM) Framework compliant system technologies, and is based on the Advanced Process Control (APC) Framework. CIM (SEMI E81-0699—Provisional Specification for CIM Framework Domain Architecture) and APC (SEMI E93-0999—Provisional Specification for CIM Framework Advanced Process Control Component) specifications are publicly available from SEMI. The function of the APC framework 230 is further well known to those skilled in the art and is fully described in U.S. patent application Ser. No. 09/393,176; entitled "Method and Apparatus For Integrating Near Real-Time Fault Detection in an APC Framework," by Michael Lee Miller, filed Sep. 9, 1999, and commonly assigned with the present application, the entire contents of which are incorporated herein by reference.

According to another embodiment of the present invention, it will be appreciated that the functionality of the film thickness optimization unit 240 may be alternatively implemented by a controller (not shown) coupled to the furnace 110, without departing from the spirit and scope of the present invention. Accordingly, in this alternative embodiment, it would not be necessary to rely upon the APC framework 230 for providing control over the furnace 110.

A metrology tool 210 is also coupled to the equipment interface 220 to collect data from the monitor wafers 205 disposed within each zone 120 of the furnace 110. In accordance with one embodiment, the metrology tool 210 is provided in the form of an ellipsometer that is adapted to measure the film thickness for each of the monitor wafers 205. It will be appreciated, however, that the metrology tool 210 need not necessarily be limited to an ellipsometer, but may take the form of various other devices that are capable of determining the film thickness of the monitor wafers 205.

In accordance with one embodiment, the furnace 110 is loaded with a batch of wafers 105, which include the monitor wafers 205 from which film thickness data may be ascertained. The temperature for each of the zones 120 (i.e., zones A, B and C) of the furnace 110 is set by the respective zone controllers 130. In accordance with one embodiment, the temperature set by each zone controller 130 is the same for each zone 120 of the furnace 110 for an initial run that processes a first batch of wafers 105. The wafers 105, 205 are baked at the set temperature for a specified bake time (i.e., bake_time).

Subsequent to baking the wafers 105, 205 for the desired bake time, a film thickness of the monitor wafers 205, which were placed in each respective zone 120 of the furnace 110, is measured by the metrology tool 210 to yield film thickness parameters (i.e., thickness_A, thickness_B, and thickness_C) for each zone 120 within the furnace 110. These film thickness parameters measured by the metrology tool 210 collectively represent the film thickness of all wafers 105 within each respective zone 120 (i.e., zones A, B and C) of the furnace 110.

According to one embodiment, the metrology tool 210, after obtaining the film thickness parameters (i.e., thickness_A, thickness_B, and thickness_C) for the monitor wafers 205 in each zone 120 of the furnace 110, forwards these parameters to the APC framework 230 via the equipment interface 220. The APC framework 230, upon receiving the film thickness parameters, forwards this data to the film thickness optimization unit 240 for analysis.

Given the variability of the actual temperature within each of the zones 120, the film thickness of each monitor wafer 205 that was placed in each zone 120 prior to baking typically may yield different film thicknesses, thus indicating film thickness variability among all the wafers 105 baked in the furnace 110. In accordance with one embodiment, the film thickness optimization unit 240 calculates a deposition rate for each of the zones 120 (i.e., dep_rate_A, dep_rate_B and dep_rate_C) based upon the film thicknesses (i.e., thickness_A, thickness_B and thickness_C) of the monitor wafers 205 as determined by the metrology tool 210 and the total bake time (i.e., bake_time) that each wafer 105 is baked in the furnace 110. These deposition rates for each zone 120 of the furnace 110 are obtained from the three equations shown below.

$$dep\_rate\_A = thickness\_A/bake\_time \quad (1)$$

$$dep\_rate\_B = thickness\_B/bake\_time \quad (2)$$

$$dep\_rate\_C = thickness\_C/bake\_time \quad (3)$$

The target to reach film thickness uniformity for each of the wafers 105 is to have the deposition rates equivalent for each of the three zones 120 of the furnace 110. In accordance with one embodiment, the film thickness optimization unit 240 selects the deposition rate for a particular zone 120 as a baseline and alters the temperature setting for the other zones 120 to attain the same deposition rate of the selected zone 120.

In accordance with the illustrated embodiment, the film thickness optimization unit 240 consults a model (not shown) stored therein, which maps the correlation of various changes in temperature to a corresponding change in deposition rate for each zone 120 of the furnace 110. For example, the model indicates if the temperature is raised 0.1° F. in zone A, that such an increase in temperature will cause the deposition rate in zone A (i.e., dep_rate_A) to increase by a factor of x amount. An increase of temperature by 0.2° F. in zone A will cause an increase in the deposition rate by a factor of y amount, and so on. This correlation between changes in temperature and changes in deposition rates is also maintained for zones B and C as well.

After the film thickness optimization unit 240 selects a deposition rate of one zone 120 in which all of the other zones 120 within the furnace 110 are to conform, it consults the model to determine an appropriate temperature setting for the other zones 120 such that they achieve substantially the same deposition rate as the selected zone 120. If, for example, dep_rate_B for zone B of the furnace 110 is selected as the baseline for the other zones 120 deposition rates (i.e., dep_rate_A and dep_rate_C), the film thickness optimization unit 240 consults the model to determine by how much the temperature setting needs to either increase or decrease in zones A and C to achieve the desired deposition rate (i.e., dep_rate_B). Accordingly, a modified temperature setting is determined for zones A and C using this model to adjust their respective deposition rates to become substantially equivalent with dep_rate_B. The film thickness optimization unit 240, upon making these temperature adjustment determinations, will cause the zone controllers 130 associated with zones A and C to adjust the temperature setting accordingly to achieve the desired deposition rate, which, in this example, is dep_rate_B. Subsequent to adjusting the temperature settings for zones A and C, the deposition rates for each of zones A, B and C should be substantially equivalent, thus achieving film thickness uniformity among the wafers 105 disposed within each zone 120 of the furnace 110.

After achieving film thickness uniformity among all the wafers 105 within the zones 120 of the furnace 110, it is desirable to also achieve a predetermined film thickness for all the wafers 105. To achieve this predetermined, uniform film thickness for each of the wafers 105 within of the furnace 110, the film thickness optimization unit 240 adjusts the baking time (i.e., bake_time) for the next run of wafers 105 placed within the furnace 110. A modified bake time (i.e., mod_bake_time) is determined by the film thickness optimization unit 240 by dividing the desired film thickness for all of the wafers 105 by the deposition rate that was previously selected by the optimization unit 240 for all of the zones 120 of the furnace 110. Thus, in the example provided above where the selected deposition rate was dep_rate_B, the new deposition rate (i.e., select_dep_rate) for all the zones 120 is actually dep_rate_B. The film thickness optimization unit 240 calculates the modified bake time from the equation shown below.

$$mod\_bake\_time = desired\_thickness/select\_dep\_rate \quad (4)$$

Accordingly, after a uniform film thickness is achieved among all of the wafers 105 within each zone 120 by adjusting the temperature settings within certain zones 120, the desired film thickness for all the wafers 105 within the zones 120 is achieved by adjusting the baking time of the wafers 105. Thus, each wafer 105 within the furnace 110 will desirably yield substantially the same predetermined film thickness regardless of which zone 120 a particular wafer 105 resided in the furnace 110 while baking.

Figure 3:
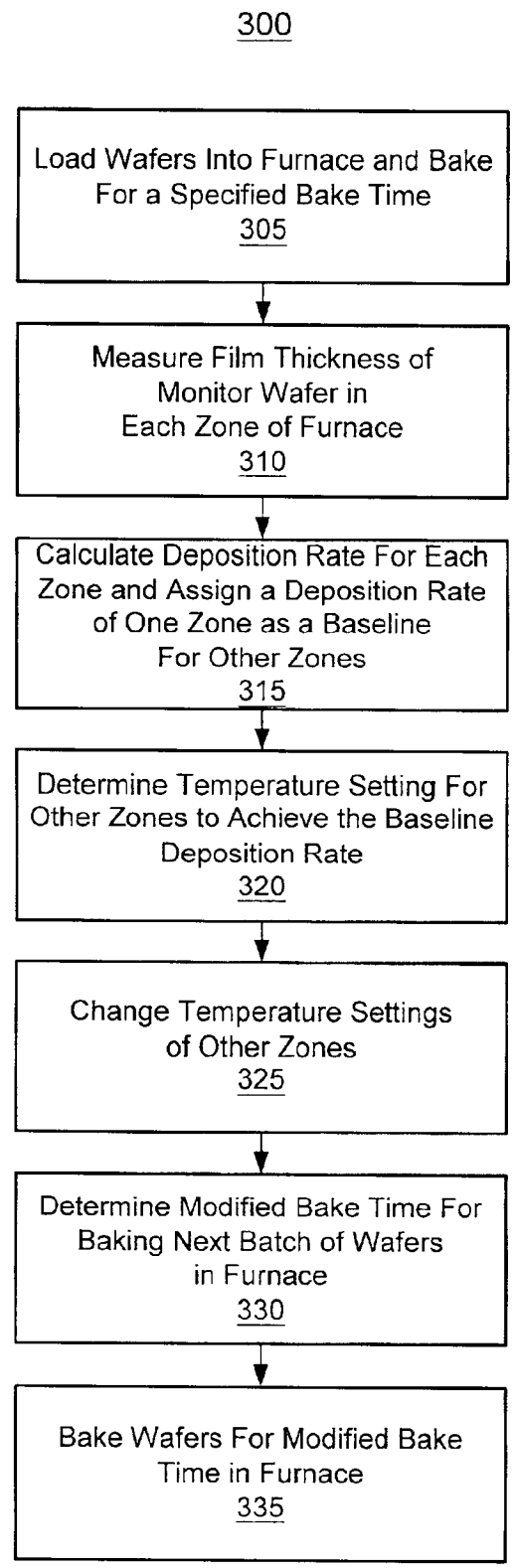
FIG. 3 illustrates a process for achieving a uniform film thickness for the wafers processed by the furnace according to one embodiment of the present invention.

Turning now to FIG. 3, a process 300 is provided for achieving a desired, uniform film thickness for wafers 105 processed by the furnace 110. The process 300 commences at block 305, where a batch of the wafers 105 are loaded into the furnace 110, with approximately one-third of the wafers 105 being placed in each zone 120. The zone controllers 130 set the temperature for each respective zone 120 and bake the wafers 105 for a specified bake time (bake_time). After baking the wafers 105 for the specified bake time, a monitor wafer 205 from each zone 120 of the furnace 110 is measured by the metrology tool 210 to determine the film thickness (i.e., thickness_A, thickness_B, thickness_C) for each of the wafers 105 from their respective zones 120 at block 310. In accordance with one embodiment, the metrology tool 210 takes the form of an ellipsometer; however, it will be appreciated that various other devices may be used for measuring the film thickness of the monitor wafers 205 in lieu of an ellipsometer without departing from the spirit and scope of the present invention.

Subsequent to determining the film thickness of the monitor wafers 205, a deposition rate for each zone 120 of the furnace 110 (i.e., dep_rate_A, dep_rate_B, dep_rate_C) is determined at block 315. As previously discussed, the deposition rate for each zone 120 is determined by dividing the total bake time by the film thickness for each monitor wafer 205 of each zone 120. A particular deposition rate, such as dep_rate_B, for example, is then selected as a baseline deposition rate to which the other zones 120 of the furnace 110 are to achieve (i.e., zones A and C).

At block 320, the film thickness optimization unit 240 determines a new temperature setting for the other zones 120 (i.e., zones A and C) in order to achieve the deposition rate that was selected (i.e., dep_rate_B) as the baseline for all the zones 120 of the furnace 110. In accordance with one embodiment, the optimization unit 240 consults a model stored therein, which maps changes in temperature for a given zone 120 to achieve a desired change in deposition rate. At block 325, the zone controllers 130, which correspond to the zones 120 in which the deposition rate is to change to the selected rate, adjust the temperature of those zones 120 to the new temperature settings.

After adjusting the temperature settings to achieve a substantially equivalent deposition rate for each zone 120, a modified bake time is determined by the film thickness optimization unit 240 for the next batch of wafers 105 that are to be baked in the furnace 110. In accordance with one embodiment, the modified bake time (i.e., mod_bake_time) is determined by dividing the selected or baseline deposition rate (i.e, select_dep_rate) by the desired film thickness (i.e., desired_thickness) for all the wafers 105 in the batch. At block 335, the furnace 110 is configured to bake the subsequent set of wafers 105 for the modified bake time (mod_bake_time).

It will be appreciated by those of ordinary skill in the art that manipulation of various other operational factors of the furnace 110 may be performed for achieving a desired, uniform film thickness among the wafers 105 as opposed to manipulating temperature, as described in the illustrated embodiment above. For example, the gas flow for each zone 120 may be altered to achieve a uniform deposition rate as opposed to altering the temperature of each zone 120 without departing from the spirit and scope of the present invention.

Figure 4:
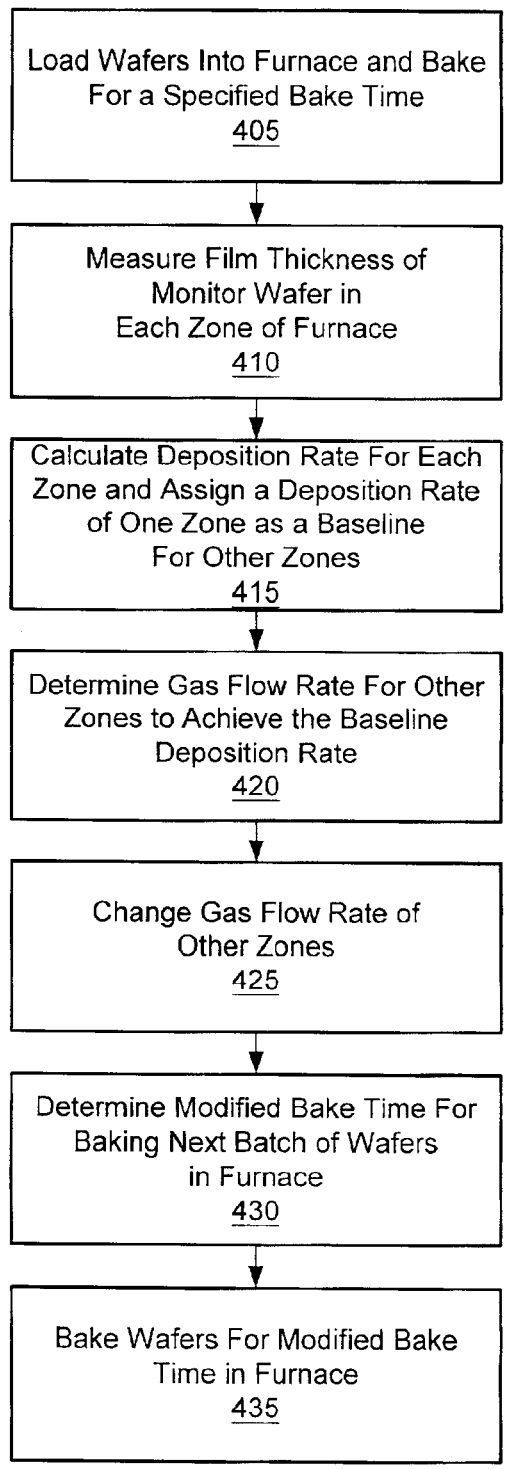
FIG. 4 shows a process for achieving a uniform film thickness for the wafers processed by the furnace according to another embodiment of the present invention.

Turning now to FIG. 4, a process 400 is provided for achieving a uniform film thickness for wafers 105 according to another embodiment of the present invention. The process 400 commences at block 405, where a batch of the wafers 105 are loaded into the furnace 110, with approximately one-third of the wafers 105 being placed in each zone 120. The zone controllers 130 control the gas flow for each respective zone 120 of the furnace 110, and bake the wafers 105 at a specified temperature for a specified bake time (bake_time). After baking the wafers 105 for the specified bake time, a monitor wafer 205 from each zone 120 of the furnace 110 is measured by the metrology tool 210 to determine the film thickness (i.e., thickness_A, thickness_B, thickness_C) for each of the wafers 105 from their respective zones 120 at block 410. In accordance with one embodiment, the metrology tool 210 takes the form of an ellipsometer; however, it will be appreciated that various other devices may be used for measuring the film thickness of the monitor wafers 205 in lieu of an ellipsometer without departing from the spirit and scope of the present invention.

Subsequent to determining the film thickness of the monitor wafers 205, a deposition rate for each zone 120 of the furnace 110 (i.e., dep_rate_A, dep_rate_B, dep_rate_C) is determined at block 415. As previously discussed, the deposition rate for each zone 120 is determined by dividing the total bake time by the film thickness for each monitor wafer 205 of each zone 120. A particular deposition rate, such as dep_rate_B, for example, is then selected as a baseline deposition rate to which the other zones 120 of the furnace 110 are to achieve (i.e., zones A and C).

At block 420, the film thickness optimization unit 240 determines a new gas flow rate for the other zones 120 (i.e., zones A and C) in order to achieve the deposition rate that was selected (i.e., dep_rate_B) as the baseline for all the zones 120 of the furnace 110. In accordance with one embodiment, the optimization unit 240 consults a model stored therein, which maps changes in gas flow rates for a given zone 120 to achieve a desired change in deposition rate. At block 425, the zone controllers 130, which correspond to the zones 120 in which the deposition rate is to change to the selected rate, adjust the gas flow rate of those zones 120 to the new gas flow rates determined.

After adjusting the gas flow rates to achieve a substantially equivalent deposition rate for each zone 120, a modified bake time is determined by the film thickness optimization unit 240 for the next batch of wafers 105 that are to be baked in the furnace 110 at block 430. In accordance with one embodiment, the modified bake time (i.e., mod_bake_time) is determined by dividing the selected or baseline deposition rate (i.e, select_dep_rate) by the desired film thickness (i.e., desired_thickness) for all the wafers 105 in the batch. At block 435, the furnace 110 is configured to bake the wafers 105 for the modified bake time (mod_bake_time).

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method for controlling a film thickness of a plurality of wafers, the wafers being baked in a multi-zone furnace for a first bake time, the method comprising:

measuring the film thickness of at least one wafer baked in each zone of the furnace;

determining a deposition rate for each zone of the furnace, the deposition rate being determined as a function of the film thickness of the wafer and the first bake time;

assigning the deposition rate of one of said zones as a baseline for the other said zones of the furnace;

adjusting the deposition rate of the other said zones of the furnace to be substantially the same as said baseline deposition rate; and baking a subsequent set of wafers in said furnace with said adjusted deposition rates.

2. The method of claim 1, further comprising:

determining a temperature setting to set the other said zones of the furnace to achieve said baseline deposition rate; and changing the temperature setting of the other said zones to the temperature setting determined.

3. The method of claim 1, further comprising:

determining a gas flow rate to set the other said zones of the furnace to achieve said baseline deposition rate; and changing the gas flow rate of the other said zones to the gas flow rate determined.

4. The method of claim 1, wherein measuring the film thickness further comprises:

measuring the film thickness of at least one wafer baked in each zone of the furnace with an ellipsometer.

5. The method of claim 1, further comprising:

determining a second bake time to bake said subsequent set of wafers in the furnace based at least upon said baseline deposition rate.

6. The method of claim 5, wherein determining a second bake time to bake said subsequent set of wafers further comprises:

selecting a desired film thickness for said subsequent set of wafers to be baked in the furnace; and determining a second bake time to bake the subsequent set of wafers as a function of the desired film thickness and the baseline deposition rate.

7. An apparatus, comprising:

a multi-zone furnace adapted to bake a plurality of wafers for a first bake time, with each zone of the furnace accommodating at least one wafer;

a metrology tool adapted to measure a film thickness of the at least one wafer baked in each zone of the furnace; and a first controller adapted to determine a deposition rate for each zone of the furnace, the deposition rate being determined as a function of the film thickness of the wafer and the first bake time, to assign the deposition rate of one of said zones as a baseline for the other said zones of the furnace, and to adjust the deposition rate of the other said zones of the furnace to be substantially the same as said baseline deposition rate; and wherein the furnace is further adapted to bake the subsequent set of wafers in the furnace with said adjusted deposition rates.

8. The apparatus of claim 7, further comprising:

at least one second controller, the at least one second controller being adapted to adjust the temperature setting of each zone of the furnace; and wherein the first controller is further adapted to determine a temperature setting to set the other said zones of the furnace to achieve said baseline deposition rate, and change the temperature setting of the other said zones to the temperature setting determined.

9. The apparatus of claim 7, further comprising:

at least one second controller, the at least one second controller being adapted to adjust the gas flow rate of each zone of the furnace; and wherein the first controller is further adapted to determine a gas flow rate to set the other said zones of the furnace to achieve said baseline deposition rate, and change the gas flow rate of the other said zones to the gas flow rate determined.

10. The apparatus of claim 7, wherein the metrology tool further comprises an ellipsometer.

11. The apparatus of claim 7, wherein the first controller is further adapted to determine a second bake time to bake said subsequent set of wafers in the furnace based at least upon said baseline deposition rate.

12. The apparatus of claim 11, wherein the first controller is further adapted to select a desired film thickness for said subsequent set of wafers to be baked in the furnace, and to determine the second bake time to bake the subsequent set of wafers as a function of the desired film thickness and the baseline deposition rate.

13. An apparatus for controlling a film thickness of a plurality of wafers, the wafers being baked in a multi-zone furnace for a first bake time, comprising:

means for measuring the film thickness of at least one wafer baked in each zone of the furnace;

means for determining a deposition rate for each zone of the furnace, the deposition rate being determined as a function of the film thickness of the wafer and the first bake time;

means for assigning the deposition rate of one of said zones as a baseline for the other said zones of the furnace;

means for adjusting the deposition rate of the other said zones of the furnace to be substantially the same as said baseline deposition rate; and means for baking a subsequent set of wafers in said furnace with said adjusted deposition rates.

14. The apparatus of claim 13, further comprising:

means for determining a temperature setting to set the other said zones of the furnace to achieve said baseline deposition rate; and means for changing the temperature setting of the other said zones to the temperature determined.

15. The apparatus of claim 13, further comprising:

means for determining a gas flow rate to set the other said zones of the furnace to achieve said baseline deposition rate; and means for changing the gas flow rate of the other said zones to the gas flow rate determined.

16. The apparatus of claim 13, wherein the means for measuring the film thickness further comprises:

means for measuring the film thickness of at least one wafer baked in each zone of the furnace with an ellipsometer.

17. The apparatus of claim 13, further comprising:

means for determining a second bake time to bake said subsequent set of wafers in the furnace based at least upon said baseline deposition rate.

18. The apparatus of claim 17, wherein the means for determining a second bake time to bake said subsequent set of wafers further comprises:

means for selecting a desired film thickness for said subsequent set of wafers to be baked in the furnace; and means for determining a second bake time to bake the subsequent set of wafers as a function of the desired film thickness and the baseline deposition rate.

* * * * *